(12) United States Patent
Balmer et al.

(10) Patent No.: US 9,864,343 B2
(45) Date of Patent: Jan. 9, 2018

(54) SUPPORT ELEMENT FOR A TIMEPIECE SENSOR

(71) Applicant: ETA SA MANUFACTURE HORLOGERE SUISSE, Grenchen (CH)

(72) Inventors: Raphael Balmer, Courrendlin (CH); Francois Klopfenstein, Delemont (CH)

(73) Assignee: ETA SA Manufacture Horlogere Suisse, Grenchen (CH)

( * ) Notice: Subject to any disclaimer, the term of this patent is extended or adjusted under 35 U.S.C. 154(b) by 50 days.

(21) Appl. No.: 14/648,758

(22) PCT Filed: Dec. 12, 2013

(86) PCT No.: PCT/EP2013/076444
§ 371 (c)(1),
(2) Date: Jun. 1, 2015

(87) PCT Pub. No.: WO2014/111210
PCT Pub. Date: Jul. 24, 2014

(65) Prior Publication Data
US 2015/0316896 A1    Nov. 5, 2015

(30) Foreign Application Priority Data
Jan. 18, 2013    (EP) .................................... 13151803

(51) Int. Cl.
*H05K 1/11* (2006.01)
*G04G 17/02* (2006.01)
(Continued)

(52) U.S. Cl.
CPC ............. *G04G 17/06* (2013.01); *G04G 17/02* (2013.01); *G04G 17/04* (2013.01); *G04G 17/045* (2013.01);
(Continued)

(58) Field of Classification Search
CPC ...... G04G 18/02; G04G 18/04; G04G 18/045; G04G 18/06; G04G 17/02; G04G 17/04; G04G 17/045; G04G 17/06; H05K 1/115
(Continued)

(56) References Cited

U.S. PATENT DOCUMENTS 4,064,552 A * 12/1977 Angelucci .............. G04G 17/02
361/750
4,783,772 A * 11/1988 Umemoto ............... B63C 11/02
368/11
(Continued)

FOREIGN PATENT DOCUMENTS

CN      201369425 Y  * 12/2009
DE   102005053877    * 5/2007 ............. G01L 19/14
(Continued)

OTHER PUBLICATIONS

Dexiang, Zhu, English Translation of CN 201369425 Y, Dec. 23, 2009, full document.*

(Continued)

*Primary Examiner* — Amy Cohen Johnson
*Assistant Examiner* — Daniel Wicklund
(74) *Attorney, Agent, or Firm* — Oblon, McClelland, Maier & Neustadt, L.L.P.

(57) ABSTRACT

A three dimensional support element for a timepiece sensor, made in 3D-MID and including integrated electrical connection paths, a flexible connection interface formed of bent wire springs or flexible finger-pieces, and a rigid connection interface.

16 Claims, 3 Drawing Sheets

(51) Int. Cl.
*G04G 17/04* (2006.01)
*G04G 17/06* (2006.01)

(52) U.S. Cl.
CPC ... *H05K 1/115* (2013.01); *H05K 2201/10265* (2013.01)

(58) Field of Classification Search
USPC ....... 361/752, 760–764, 807, 809, 813, 825; 174/520, 527, 528, 529, 532, 536, 555
See application file for complete search history.

(56) References Cited

U.S. PATENT DOCUMENTS

| | | | | |
|---|---|---|---|---|
| 5,357,488 | A * | 10/1994 | Udo | G04B 47/06 368/11 |
| 5,592,442 | A * | 1/1997 | Nishikawa | G04G 21/02 368/11 |
| 7,159,469 | B2 * | 1/2007 | Claude | G04G 21/02 368/11 |
| 7,963,705 | B2 * | 6/2011 | Staeber | G02B 6/3897 385/88 |
| 2003/0070483 | A1 * | 4/2003 | Mueller | G01C 19/5783 73/493 |
| 2007/0179551 | A1 * | 8/2007 | Iyer | A61N 1/3754 607/36 |
| 2009/0266173 | A1 * | 10/2009 | Kobayashi | G01L 9/0075 73/724 |
| 2009/0314096 | A1 * | 12/2009 | Colombo | G01L 19/0084 73/754 |
| 2010/0006327 | A1 | 1/2010 | Yu et al. | |
| 2010/0035671 | A1 | 2/2010 | Lee et al. | |
| 2011/0191044 | A1 * | 8/2011 | Stafford | A61B 5/0002 702/65 |
| 2011/0219882 | A1 * | 9/2011 | Nakamura | G04G 17/04 73/756 |
| 2012/0060368 | A1 | 3/2012 | Yu et al. | |
| 2012/0274508 | A1 * | 11/2012 | Brown | G04G 17/04 342/357.25 |
| 2013/0206595 | A1 * | 8/2013 | Lee | G01N 27/3272 204/403.01 |
| 2013/0328730 | A1 * | 12/2013 | Guterman | B29C 33/76 343/702 |
| 2014/0336930 | A1 * | 11/2014 | Thomas | G01C 21/165 701/472 |

FOREIGN PATENT DOCUMENTS

| | | |
|---|---|---|
| EP | 2557904 A1 | 2/2013 |
| FR | 2388460 | 11/1978 |
| WO | 2007/054557 A1 | 5/2007 |

OTHER PUBLICATIONS

International Search Report dated Jun. 6, 2014 in PCT/EP2013/076444 filed Dec. 12, 2013.

* cited by examiner

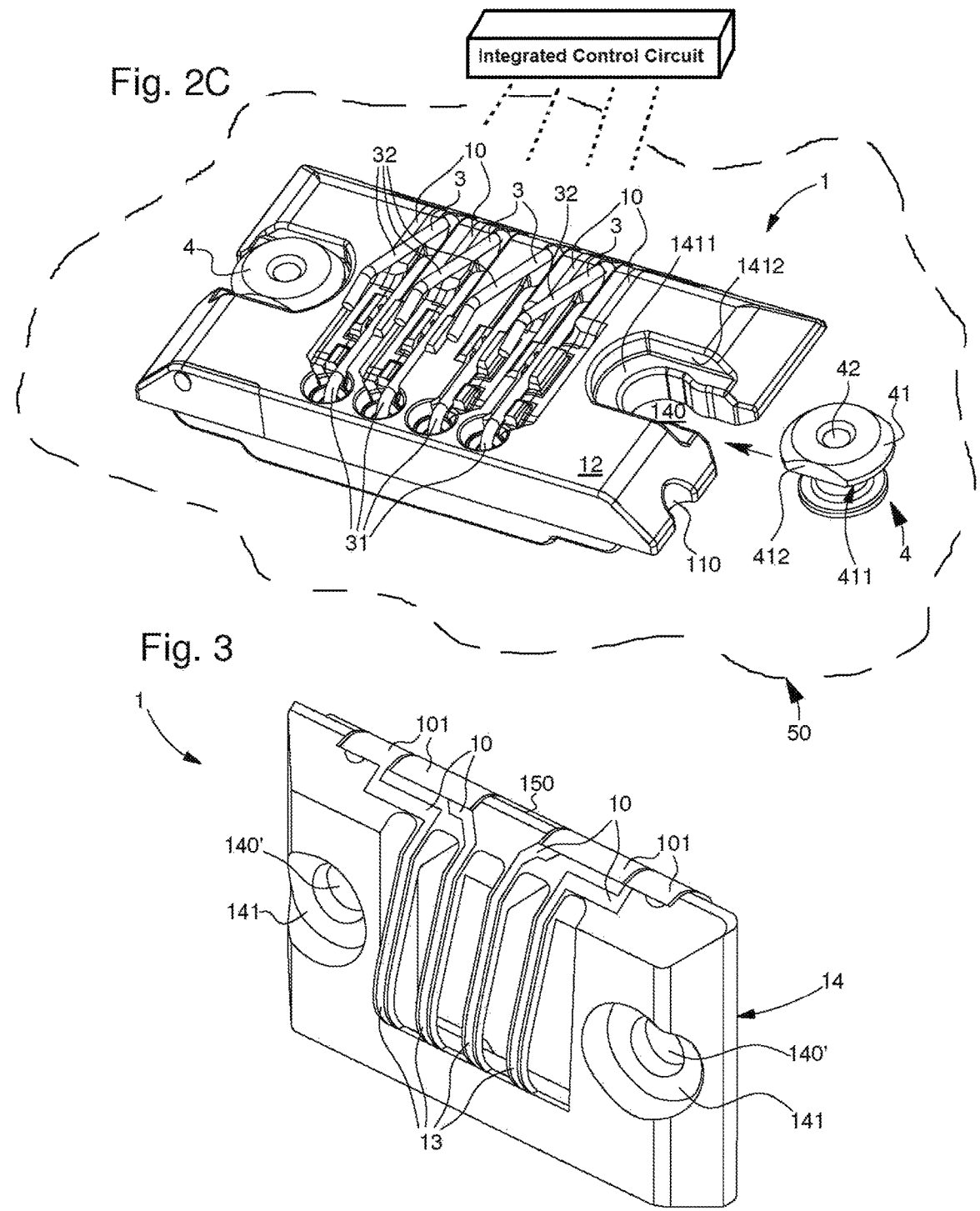

US 9,864,343 B2

SUPPORT ELEMENT FOR A TIMEPIECE SENSOR

CROSS-REFERENCE TO RELATED APPLICATIONS

This is a National Phase Application in the United States of International Patent Application PCT/EP2013/076444 filed Dec. 12, 2013 which claims priority on European Patent Application No. 13151803.7 filed Jan. 18, 2013. The entire disclosures of the above patent applications are hereby incorporated by reference.

The present invention concerns a support element for a sensor intended to be mounted in an electromechanical watch.

For wristwatches provided with sensor modules, for example temperature or pressure sensors, it is necessary to ensure, on the one hand, robust attachment of the sensor to the case, and to provide, on the other hand, interfaces for electrical connection to an integrated control circuit.

To achieve this, if permitted by the geometric shape of the sensors, they may be disposed in correspondingly shaped housings arranged in the case middle; otherwise they are generally secured to a lateral wall of the case middle via an intermediate part acting as support and securing member. The sensor module also generally includes a printed circuit board (PCB), on which electrical connection paths are formed by galvanic deposition. This PCB contains electrical connectors for the sensor, to which it is physically connected, and controls the electrical connections to the main integrated control circuit, which is also arranged inside the case, usually on another PCB, particularly via a zebra connector.

Owing to the various parts required for assembly and the various connection interfaces, these sensor modules are relatively complex and expensive to assemble.

In the telecommunications field, in-mould labelling (IML) is also known, which consists in forming a conductive pattern on a film. This technology makes it possible to integrate antennas, known as film antennas, directly on a wall of a mobile terminal case. US Patent No 2010/0035671 discloses a mobile terminal provided with such an antenna arranged on an upper face of the case, and connected to a PCB by a via hole in which conductive resin is injected and a connector. The proposed arrangement constitutes an advantageous alternative compared to external antennas, which are more likely to be damaged, but it is not transposable to the field of horology, where the inner surfaces of the case are not necessarily flat like the films used for antennas.

Again in the field of telecommunications, the technology of three-dimensional injection moulding and laser structuring of interconnection paths is also known. EP Patent No 2557904 describes such a substrate for an electronic module with three-dimensional, laser structured, interconnection paths, intended to permit easier integration inside a case. This type of technology is not, however, suitable for the field of horology where dimensions are smaller, particularly for timepieces worn on the wrist, and where positioning constraints are much greater.

There exists therefore a need for sensor modules that are free of these limitations.

In particular, it is an object of the present invention to provide a support element for a timepiece sensor which permits easier assembly and involves a more limited number of parts and interfaces.

These objects are accomplished owing to a support element for a timepiece sensor, characterized in that it is made in 3D/MID, so that it has a three-dimensional shape and integrated electrical connection paths, and further includes a rigid connection interface and a flexible connection interface formed by bent wire springs assembled to the support element or flexible finger-pieces on which electrical connection paths are arranged.

One advantage of the proposed solution is that it makes it possible to integrate, in a single part, mechanical and electronic functionalities for the assembly of the sensor in a watch case and the interconnection thereof to an integrated control circuit, which considerably simplifies the assembly process and at the same time reduces congestion inside the case.

Another advantage of the solution of the present invention is that it makes it possible to dispense with the rigid or flexible PCBs and Zebra connectors usually used in the watch industry, for the sensor support element, which means that connection interfaces can be omitted and the ohmic resistance of the module is minimised. Thus, Joule effect losses are also reduced.

Yet another advantage of the solution of the present invention is that it provides improved flexibility of assembly inside a watch case, the sensor module hence being capable of being mounted on the dial side and back cover side, whereas a solution using zebra connectors can only be mounted from the dial side of a watch. Further, the sensor module can be assembled completely independently and thus more easily relocated inside the case, or positioned at different locations in different cases.

Further, the fact that the timepiece sensor support element according to the invention includes a first rigid interface for connection to the sensor, and a second flexible interface connection intended to be connected to an integrated control circuit, has the advantage of requiring less precision to position the sensor module inside the case, the flexible connectors being capable of taking up large operating clearances, unlike a PCB.

Other features and advantages of the invention will become clear from the following detailed description, and drawings, in which:

FIG. 2C shows the sensor support element according to the preferred embodiment illustrated in FIG. 2B with all the wire springs assembled and the mounting feet inserted in lateral notches.

FIG. 3 shows a sensor support element for a timepiece according to a second preferred embodiment including flexible finger-pieces on which are arranged laser structured electrical connection paths.

3D-MID, which is an acronym for three dimensional ("3D") moulded interconnect devices, consists of manufacturing an injected moulded plastic part containing integrated electronic connection paths, produced, in particular, by laser direct structuring (LDS). In a first step, the three dimensional geometric shape of the part is determined by the shape of a mould, into which a first non-conductive material, specifically optimised for the LDS method, is injected. Then the surfaces which will become the connection paths are laser structured on the injection-moulded part. Finally, the part thereby formed undergoes a chemical metallization treatment, during which only the surfaces previously exposed to the laser will bind to the metallization. This technique provides increased flexibility in the design of parts for integration in devices of a given shape, such as, for example, antennas for mobile telephones, which are subject to increasingly critical constraints in terms of volume. It also optimises the process of producing electronic components with improved productivity for mass production. As an alternative to the LDS technique described above, 3D-MID parts can also be produced by other methods, and notably by a two component injection technique. This method uses two plastic materials, one of which may be metallized to create the electrical interconnection paths, while the other material remains passive. This two component (2C) technique requires greater investment than the LDS technique, but may further reduce costs per part for large production volumes. Other techniques may also be envisaged, such as, for example, direct silver metallization by aerosol spraying, followed by a sintering method.

The use of a sensor support element manufactured in 3D-MID technology for a timepiece within the scope of the invention makes it possible, on the one hand, to dispense with a dedicated sensor support element, usually of flat shape, which results in a saving of space and simplification of the assembly process, and on the other hand with a zebra connector, usually employed for connection to the integrated control circuit, which minimises the connection interfaces and provides more flexibility in positioning the sensor module inside the case.

FIGS. 1A-1B and 2A-2C show a sensor support element 1 according to a first preferred embodiment of the invention, and FIG. 3 shows a sensor support element 1 according to a second preferred embodiment of the invention.

According to each of the two preferred embodiments, support element 1 includes a first rigid interface for connection to sensor 2 and a second flexible interface for connection to an integrated circuit, in order to take up operating clearances that are often critical in the field of horology and thus to ensure contact with the integrated control circuit.

Figure 1A:
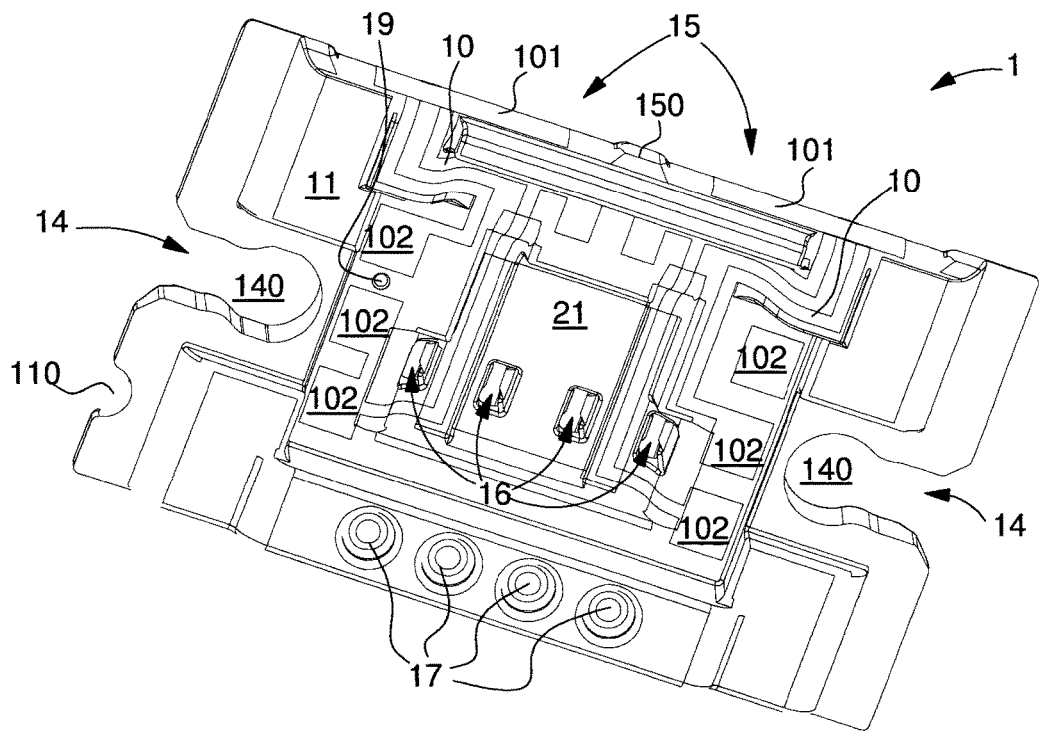
FIG. 1A shows a view of a first face of a sensor support element for a timepiece according to a first preferred embodiment, in which is arranged a housing for the sensor and the connection interface with the sensor.

In FIG. 1A, sensor support element 1 is shown from the side of a first face 11 on which is arranged the connection interface with sensor 2 for which a housing 21 is provided at the centre. In housing 21, first via holes 16 are provided to form securing clips 18 on the opposite side during moulding of sensor support element 1, seen in the following FIGS. 2A-2C, whereas the second via holes 17 are arranged underneath to provide double securing and connection security, as explained below with reference to the same FIGS. 2A-2C. At one end of electrical connection paths 10, which are preferably laser structured here, square connectors 102 are visible, disposed on the periphery of housing 21 to connect sensor 2, whereas on the upper edge of support element 1, enlarged portions 101 of electrical connection paths 10 are visible, disposed in recesses 15 arranged symmetrically around a central protuberance 150. These enlarged portions are intended to facilitate implementation of electrical tests of the support elements and to facilitate good interconnection of the paths through the process of laser structuring the paths, while the arrangement of these enlarged paths 101 in recesses 15 on one edge of the support element is intended to protect them from any untimely deterioration, particularly by abrasion, during transport and/or handling of support element 1. It is therefore possible to use bulk transport technology for support elements 1, optimising returns without thereby risking damaging the electrical conduction properties of support element 1.

On the left side of the support element is arranged a first laser guide mark 110 for correct positioning during laser structuring of the paths. To the left of cavity 21 there is a round which acts as visual guide mark for correct proper assembly of the support element. This second assembly guide mark 19 takes the form of a hollow here. In the middle and on each side of first face 11 of support element 1 there are securing members 14 intended to mount support element 1 on the watch case; according to the first preferred embodiment described, these members 14 for securing to the case take the form of notches 140, which are provided to cooperate with mounting feet 4 described below and seen in FIGS. 2B-2C.

Figure 1B:
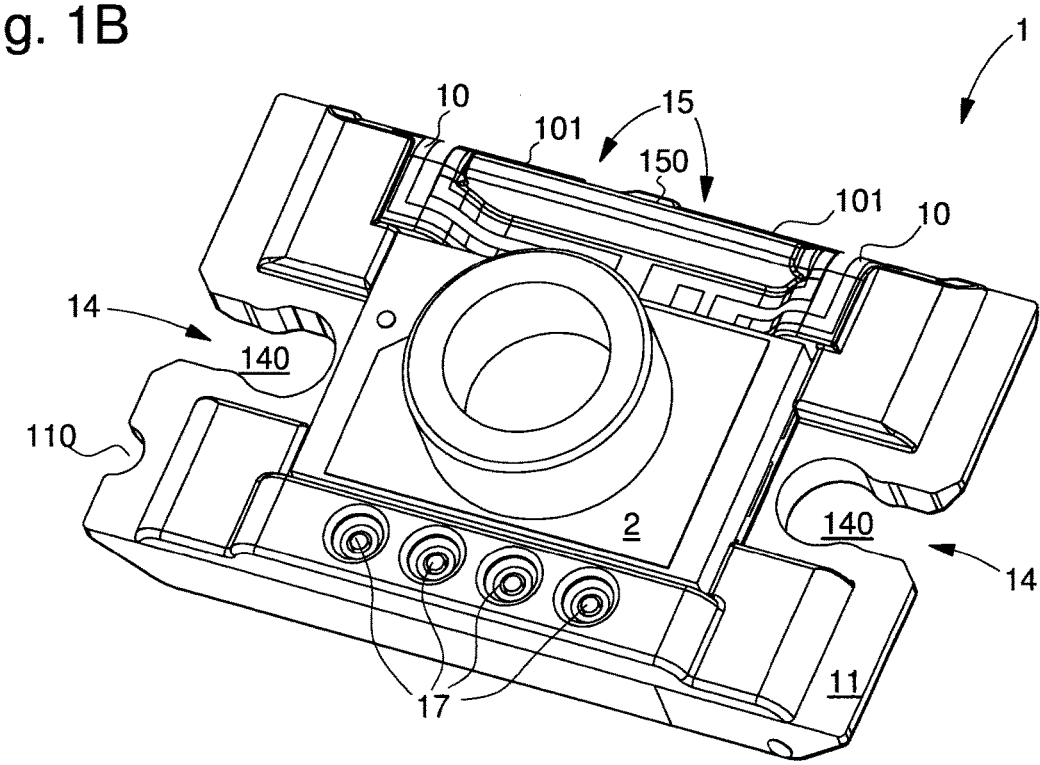
FIG. 1B shows the sensor support element of FIG. 1A with the sensor assembled in its housing.

FIG. 1B shows the sensor support element 1 illustrated in FIG. 1A, i.e. seen from the side of the first face 11 in the central portion of which sensor 2 is now mounted. All the references of FIG. 1B, except sensor 2, are already illustrated in FIG. 1A (securing members 14 in the form of notches 140, second via holes 17, connection paths 10 and enlarged portions 101, recesses 15 and central protuberance 150) and thus have already been described.

Figure 2A:
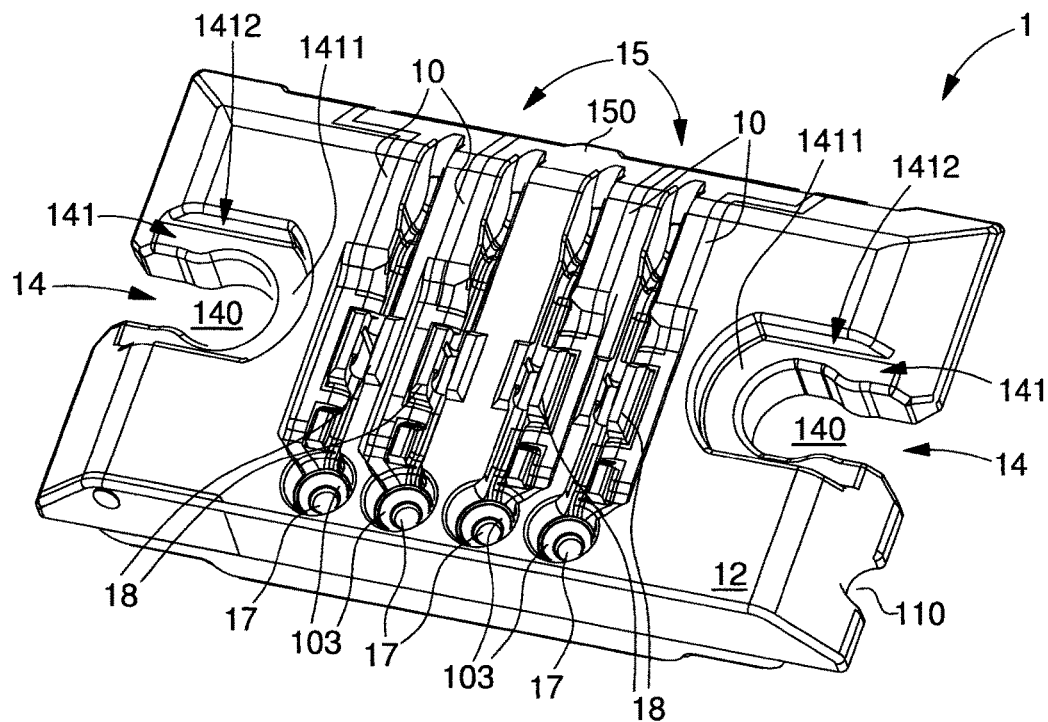
FIG. 2A shows a view of the opposite face of the sensor support element according to the preferred embodiment illustrated in FIG. 1A in which is arranged the connection interface with an external integral circuit.
Figure 2B:
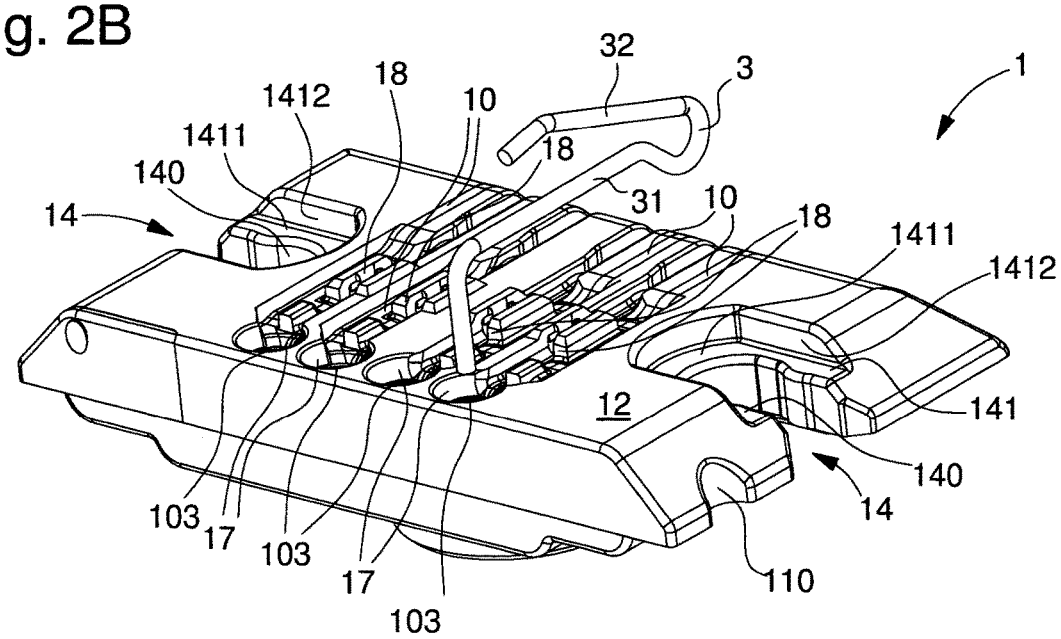
FIG. 2B shows a view of the face of the sensor support element according to the preferred embodiment illustrated in FIG. 2A, showing the shape and the positioning of wire springs.

FIGS. 2A to 2C show sensor support element 1 seen from a second face 12, which constitutes the opposite face to first face 11 illustrated in FIGS. 1A and 1B. FIG. 2A, which again shows the first laser guide mark 110, the laser structured electrical connection paths 10 and recesses 15 and central protuberance 150, illustrates that securing notches 140 are provided, on the other side, with a shoulder 141 which has, on the one hand, a bearing surface 1411 for assembly of mounting feet 4 seen in FIG. 2C and a rotation lock surface 1412, i.e. vertical and rectilinear walls which prevent any securing part housed inside notch 140 and on the shoulder to be driven in rotation, for example during a screwing operation.

FIG. 2A also shows, at the centre of sensor support element 1, hollows arranged to receive wire springs 3, one of which is visible in FIG. 2B and all of which are shown in the mounted position in FIG. 2C. Each of these hollows is bordered by a series of clips 18 which allow wire springs 3 to be mounted to sensor support element 1. Wire springs 3 are first of all clamped between two adjacent clips 18 bordering a hollow, then forced inwards, clips 18 then holding the springs pressed inside their housing. In each of the 4 second via holes 17 are arranged connection eyelets 103 intended to be electrically connected to each of wire springs 3.

FIG. 2B illustrates the same second face 12 of sensor support element 1 illustrated in FIG. 2A, during the assembly of a wire spring 3 inside a second via hole 17. All the references are identical to those already described with reference to FIG. 2A, except the wire spring 3 used to form the flexible interface for connection to an integrated circuit positioned elsewhere inside the case. Wire spring 3 has a particular shape, bent almost at 180°, a first portion 31 being intended to be secured to sensor support element 1 by being confined inside hollows and retained by clips 18, while a second portion 32, the end of which is free and flexible, is that which will be connected to the integrated control circuit and will be able to take up operating clearances. Schematically, the first wire spring portion 31 thus forms the part for connection to the 3D-MID sensor support element 1, while the second portion 32 of wire spring 3 is that which forms the part for connection to the integrated circuit. Although other geometric shapes are possible, the particular hairpin shape of the preferred embodiment illustrated makes it possible to provide a maximum surface of contact at each of the connection interfaces, i.e. with the integrated circuit and with the sensor support element, while exhibiting sufficient robustness at the joint between each of the connection portions to take up operating clearance if necessary, and at the same time to exert a return force of sufficient intensity to press the second portion 32 into contact with a contact part with the integrated circuit when the first and second portions 31, 32 are moved closer to each other.

In order to further improve the securing of wire springs 3 to sensor support element 1 and also to provide a redundancy of electrical contacts, for example in the event of a violent shock tending to move slightly first portion 31 of wire springs 3 secured to the support element, it is provided, according to the preferred embodiment described, to solder the lower end of wire spring 3, bent at 90 degrees here towards the bottom of first portion 31 fixed to support element 1, and which is brought into contact with connection eyelets 103, at the upper end of second via holes 17. According to a variant, the end of wire spring 3 could also be bonded in the second via hole 17 by means of an electrically conductive adhesive, particularly silicon based conductive adhesives, with thixotropic properties, which are not liable to run, including during the polymerisation process, unlike a conventional tin alloy used for soldering and which is totally liquefied during this operation, so that it is more difficult to control the long term quality and reliability of the soldered area. An additional advantage of a silicon conductive adhesive is its mechanical flexibility, which can render the assembly more robust to mechanical stresses, shocks or vibrations, unlike a tin solder which remains very rigid and may, for example, crack under mechanical stress. Finally, the use of a conductive adhesive has the advantage of hardening at lower temperatures than the melting point of tin (around 130° C. rather than 250° C.), so that the risk of damaging the plastic of the moulded support piece is removed, unlike during a soldering operation.

It is also possible to envisage, in a later use of sensor support element 1 of the invention, replacing wire springs 3 with versions which have a longer or shorter portion 32, in order to be more flexible as regards the position of connection to the PCB.

FIG. 2C shows all of wire springs 3 in a position assembled to support element 1 of sensor 2, and mounting feet 4 which include a truncated cylindrical collar 41 which fits onto shoulder 141 of each notch 140 once the cylindrical portion of the feet has been engaged and clipped from the outside. The truncated cylindrical collar 41, like shoulder 141 of securing notch 140, includes an axial stop surface 411 which can be held in contact against the axial bearing surface 1411 of the shoulder, and a rotation lock surface 412, which is formed by the vertical rectilinear wall of the truncated portion of collar 41. The left mounting foot 4 is shown in the assembled position on the support element, while the right mounting foot 4 is shown during snap fitting in the securing notch. This securing structure with feet 4 and notches 140 of a particular shape advantageously allows sensor support element 1 to be secured, for example, from outside the case, with screws able to be inserted into central apertures 42 in each foot 4. This method of securing from outside the case—using a pierced hole in the case wall—is evidently advantageous compared to a method of securing from the inside of the case, where the lack of space and congestion caused by various parts rapidly makes any screwing operation relatively inconvenient. Further, this assembly method with mounting feet 4 provides increased freedom to position support element 1 in the direction perpendicular to the plane of second face 12, thereby rendering the entire assembly robust to any mounting offset of the sensor in this radial direction perpendicular to a wall of the case, a non-limiting example of an internal wall 50 of the case being shown in FIG. 2C. Indeed, there is therefore never any excess lateral stress on the securing screws and corresponding joints, which ensures the sealing of the watch in all circumstances.

FIG. 3 illustrates another preferred embodiment of sensor support element 1 according to the invention, wherein the flexible connection interface with the integrated circuit is no longer formed by wire springs, but by flexible finger-pieces 13 formed in one piece with the rest of the 3D-MID sensor, and on which electrical connections paths 10 are directly arranged, either laser structured or obtained, for example, by two component injection. According to this embodiment, the method of manufacturing the sensor support element is thus further simplified; however this manufacturing method has drawbacks, over the long term, in terms of connection quality since connection finger-pieces 13 are liable to wear at the joint with the sensor body, electrical connection paths 10 may then deteriorate at this location, or even break. Another difference between this second preferred embodiment and that illustrated in the preceding Figures concerns the method of securing to the case, since it can be observed that the support element no longer has lateral notches 140, but through holes 140', whose cylindrical shape permits the insertion of a screw head through the interior for securing to the case. As previously discussed, this variant has the drawback of being more fragile, but the advantage, however, of requiring one less part and consequently, a unit cost saving, without an improvement in production output. As for the embodiment illustrated by FIGS. 1A-B and 2A-C, it will, however, be noted that the enlarged sections 101 of electrical connection paths 10 and their arrangement in recesses 15 symmetrically arranged around a central protuberance 150 have been retained to facilitate electrical testing and to protect the paths during any bulk treatment of support elements 1.

The invention claimed is:

1. A support element for a timepiece sensor, comprising:
    a support that is made in 3D/MID, so that the support element has a three-dimensional shape and integrated electrical connection paths;
    a first rigid connection interface to connect to the timepiece sensor; and
    a second flexible connection interface to connect to an integrated control circuit, the second flexible connection interface formed by at least one bent wire spring assembled to the support, or flexible finger-pieces on which are arranged the electrical connection paths, wherein
    the second flexible connection interface, formed by the at least one bent wire spring or the flexible finger-pieces, projects outward from a second face of the support that is opposite a first face of the support mountable with the timepiece sensor, and
    the first rigid connection interface and the second flexible connection interface are connected by the electrical connection paths, without the support element including any printed circuit board connection interface between the timepiece sensor and the integrated control circuit.

2. The support element for a timepiece sensor according to claim 1, wherein the second flexible connection interface is formed by the at least one bent wire spring, and the at least one bent wire spring includes a first portion secured to the support and a second flexible, free portion.

3. The support element for a timepiece sensor according to claim 2, wherein the support includes clips to hold the at least one bent wire spring.

4. The support element for a timepiece sensor according to claim 3, wherein the support includes at least one via hole in which the electrical connection paths form eyelets configured to be electrically connected to the at least one bent wire spring.

5. The support element for a timepiece sensor according to claim 4, wherein one end of the at least one bent wire spring is soldered in the at least one via hole.

6. The support element for a timepiece sensor according to claim 4, wherein one end of the at least one bent wire spring is bonded in the at least one via hole by an electrically conductive adhesive.

7. The support element for a timepiece sensor according to claim 6, wherein the electrical connection paths include enlarged portions disposed in recesses arranged on one edge of the support.

8. The support element for a timepiece sensor according to claim 6, wherein the support includes a first guide mark to aid assembly and a series of second laser guide marks to guide machining of the electrical connection paths.

9. The support element for a timepiece sensor according to claim 6, wherein the support includes a securing notch including a shoulder including an axial bearing surface and a rotation lock surface.

10. A timepiece comprising a sensor module formed of a sensor mounted on the support element according to claim 8, wherein the support element is assembled to an internal wall of a case of the timepiece with aid of mounting feet.

11. The support element for a timepiece sensor according to claim 1, wherein the second flexible connection interface, formed by the at least one bent wire spring or the flexible finger-pieces, extends in a longitudinal direction along the second face with a gap between the second flexible connection interface and second face.

12. The support element for a timepiece sensor according to claim 11, wherein the second flexible connection interface is formed by more than one of the bent wire spring that are parallel to one another in the longitudinal direction, or is formed by the flexible finger-pieces that are parallel to one another in the longitudinal direction.

13. The support element for a timepiece sensor according to claim 11, wherein the second flexible connection interface, formed by the at least one bent wire spring or the flexible finger-pieces, extends inclined relative to the second face.

14. The support element for a timepiece sensor according to claim 1, wherein the second flexible connection interface is formed by the at least one bent wire spring, and the first face of the support is mountable with the timepiece sensor disposed between recesses arranged on one edge of the support to accommodate enlarged portions of the electrical connection paths and at least one via hole in which the electrical connection paths form eyelets configured to be electrically connected to the at least one bent wire spring.

15. The support element for a timepiece sensor according to claim 1, wherein the second flexible connection interface is formed by the at least one bent wire spring, the first face of the support includes a housing to mount the timepiece sensor, and the support includes at least one first via hole in the housing that forms at least one clip on the second face of the support to hold the at least one bent wire spring.

16. The support element for a timepiece sensor according to claim 1, wherein the electrical connection paths wrap around an edge of the support, so that the electrical connection paths extend into a housing to mount the timepiece sensor on the first face of the support, and extend on the second face of the support.

\* \* \* \* \*